United States Patent [19]

Schertler

[11] Patent Number: 5,391,231
[45] Date of Patent: Feb. 21, 1995

[54] HOLDING ARRANGEMENT FOR A PLANAR WORKPIECE AND AT LEAST ONE SUCH HOLDING ARRANGEMENT

[75] Inventor: Roman Schertler, Wolfurt, Austria
[73] Assignee: Balzers Aktiengesellschaft, Liechtenstein
[21] Appl. No.: 43,179
[22] Filed: Apr. 6, 1993
[30] Foreign Application Priority Data
    Apr. 6, 1992 [CH] Switzerland .............. 1114/92
[51] Int. Cl.⁶ .............. C23C 16/00; B25B 1/00
[52] U.S. Cl. .................. 118/503; 118/728; 118/729; 269/254 R; 269/287
[58] Field of Search ......... 269/254 R, 287, DIG. 903; 118/728, 503, 729

[56] References Cited

U.S. PATENT DOCUMENTS

| | | | |
|---|---|---|---|
| 4,201,374 | 5/1980 | Gras | 269/254 R |
| 4,703,920 | 11/1987 | Grabbe | 269/254 R |
| 4,779,887 | 10/1988 | Shaw | 118/503 |
| 4,817,556 | 4/1989 | Mears | 118/503 |
| 4,817,559 | 4/1989 | Ciparisso | 118/503 |
| 5,192,087 | 3/1993 | Kawashima | 118/503 |
| 5,253,411 | 10/1993 | DiNapoli | 269/254 R |
| 5,281,320 | 1/1994 | Turner | 269/154 R |

Primary Examiner—Richard Bueker
Attorney, Agent, or Firm—Notaro & Michalos

[57] ABSTRACT

A holder and carrier for a plurality of holders is constructed to engage the band-like edge of a thin disk-shaped workpiece. The holder comprises a plurality of spring bars which are connected at corners to form a polygon which engages the outer edge of the workpiece. Each corner is held within a slot shaped receptacle which in turn is defined in a frame for holding the workpiece with minimum shadowing and minimum danger of scratches, warping of other disadvantageous effects.

19 Claims, 5 Drawing Sheets

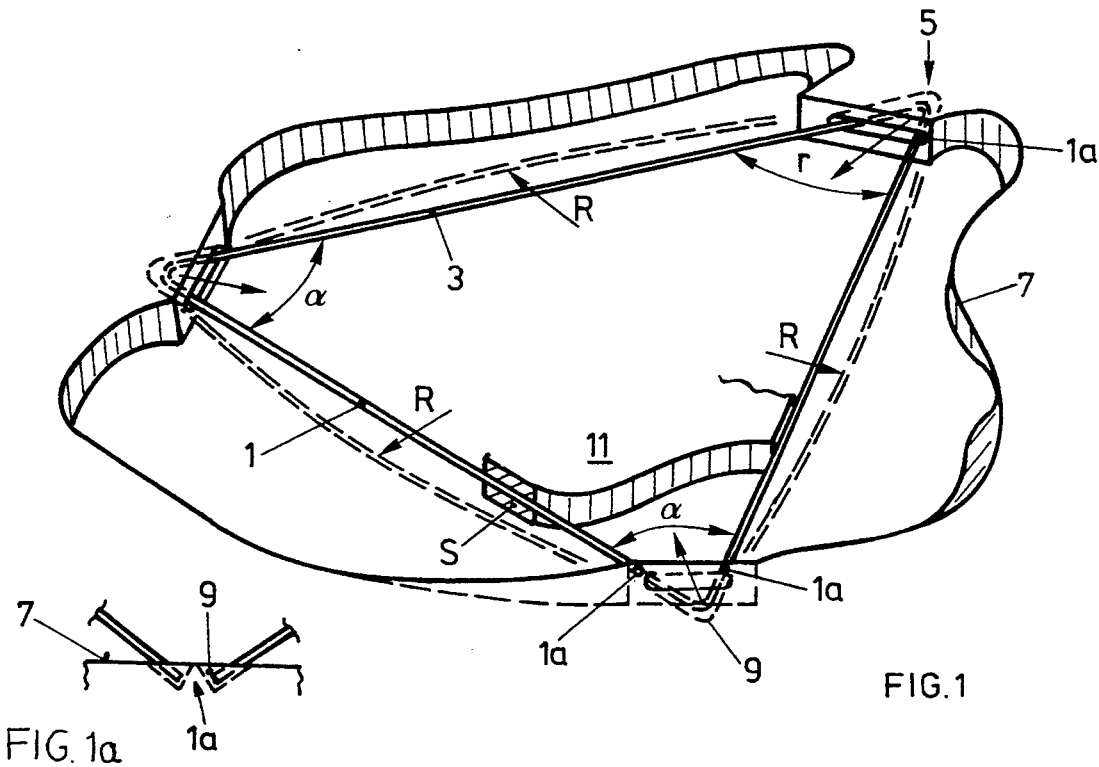
FIG. 1
FIG. 1a
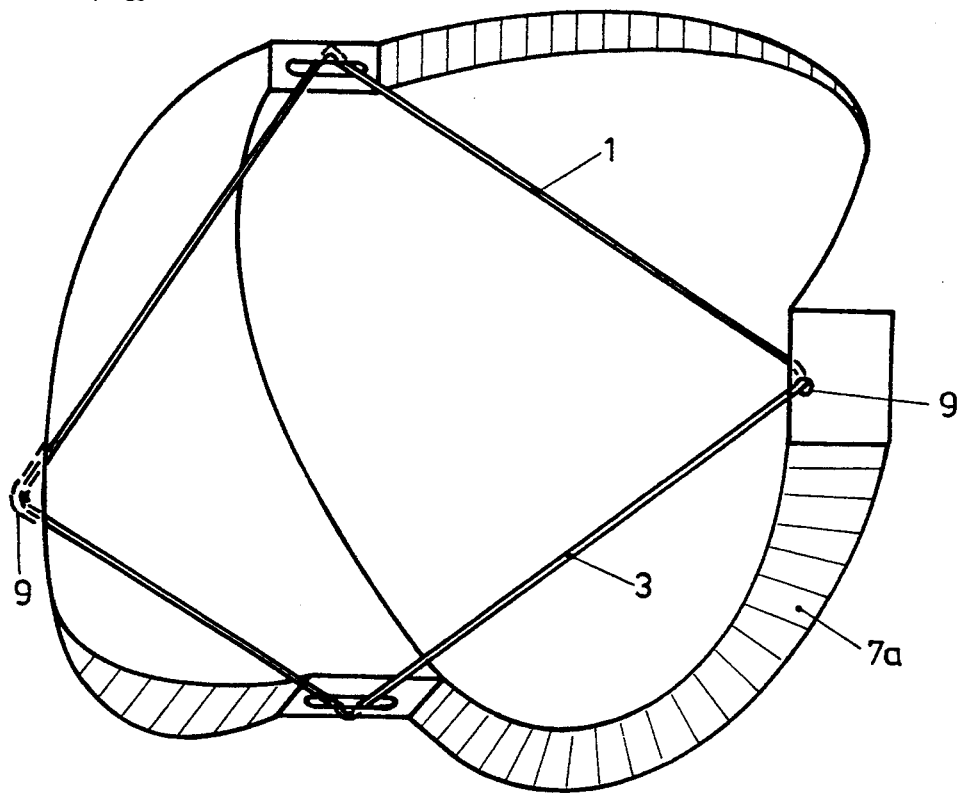
FIG. 2

HOLDING ARRANGEMENT FOR A PLANAR WORKPIECE AND AT LEAST ONE SUCH HOLDING ARRANGEMENT

FIELD AND BACKGROUND OF THE INVENTION

The present invention relates to a holding arrangement for a planar workpiece with an at least partially encircling band-like edge face, a carrier arrangement with at least one such holding arrangement as well as uses for the holding arrangement and stated carrier.

The starting point of the present invention is the problem of holding thin, disk-shaped workpieces such as, in particular, disks for the fabrication of storage disks, be they CDs, hard disks or magneto-optical storage disks or semiconductor wafer disks. The considered holding device is intended for use during surface treatment processes on workpieces such as during PVD or CVD coating processes of all known variants as well as their mixed forms such as PECVD (plasma enhanced CVD), further for etching processes and thermal processes, wherein most of these processes are vacuum processes, CVD or thermal processes, but not necessarily.

In most of the just outlined technical fields the problem of holding resides in that thin disks, down to thickness dimensions of 0.5 mm with diameters of $\geq 2$ cm up to 10 and more cm, must be held, and the following conditions must be optimally fulfilled:
a) The smallest possible areas of the workpiece surfaces should be covered or shadowed with respect to the intended treatment process.
b) It should be possible to absorb dimensional changes, brought about thermally, of the workpieces if possible free of tension, in order to prevent warping of the workpieces or even fractures.
c) When placing and removing the workpieces from the holding device the danger of scratches should be minimal as well as also the friction taking place, with which concomitantly, friction particle contamination for the surface treatment is to be minimized.
d) The stated workpieces are to be subjected to defined holding forces by the holding device.
e) The holding device is to be suitable to be loaded or unloaded by automatic handling robots.
f) The holding device should make possible the optimally dense workpiece holding on a carrier for several workpieces.
g) Loading and unloading the holding device should be simple, should require low force and time expenditures for the purpose of economical operation in production.

SUMMARY OF INVENTION

The foregoing optional conditions are met in a preferred variation of use for the holding arrangement according to the present invention. On the other hand, in the course of the following specification, it will be readily apparent that due to its simplicity, the suggested holding arrangement is also suited for holding planar workpieces, in cases of application in which far less requirements are made for the above stated parameters. Consequently the holding arrangement according to the invention, which will be explained in the following and which has the goal of fulfilling primarily the above stated requirements a) to g), can also be used wherever the stated requirements can be significantly relaxed or even do not occur at all, or in corresponding technical fields of application where simply plane workpieces are to be held.

The holding arrangement according to the invention is distinguished by fulfilling the above stated requirements.

The solution according to the invention builds on the finding that spring bars, for example comprising spring steel, can be implemented so as to be so thin that the engagement from the edge with a planar workpiece is readily possible even if the workpiece is not thicker than 0.5 mm. Furthermore, the following advantages are achieved:
a) Since the spring bars engage the planar workpieces at their edge and at locations distributed around their edge, all undesired covering of the workpiece surface which conventionally is to be primarily uniformly surface-treated, is avoided.
b) Since the spring bars are mounted in receptacles and can bend out resiliently, suitable dimensioning of the spring bars and the receptacles will result in the least possible load on the workpiece even under thermal expansion and/or an even distribution of tension around the workpiece periphery.
c) Because, during loading or unloading of the workpieces, a relative motion between the workpiece surface and the holding arrangement according to the invention does not need to take place, but rather the workpiece can be inserted only straight along its band-like encircling edge face into the holding arrangement—between the spring bars—which are extremely thin, an extremely low danger of damage to the planar workpiece surface results and due to the very short frictional action paths, extremely low frictional stress and consequently an optimally low danger of contamination of the treatment process through friction particles, occurs.
d) Since the total spring characteristic of the holding arrangement according to the invention is defined by the characteristics of the essentially linear spring bars, and their support in the receptacles in the frame, the forces which act radially inwardly upon the planar workpiece on its band-like circulating edge face, are defined.
e) Due to the extremely simple insertion and withdrawal motion by which a planar workpiece can be inserted between the spring bars or removed therefrom, and a handling lift which for this purpose is small, the arrangement according to the invention is extremely well suited for automatic handling.
f) Due to the fact that the holding arrangement according to the invention, viewed from a workpiece radially outwardly, requires only just the space for the spring bars and the provided receptacles on the frame, on a carrier for several holding arrangements for several workpieces the latter can be packed extremely tightly together and consequently the carrier surface can be utilized optimally.

The invention is consequently based on the concept of using as a holding device, a polygon of spring bars, in the sense of bending bars, the end portions of which are supported terminally with a correspondingly layed-out degree of freedom of motion.

In a preferred embodiment of the invention, the end portions of the spring bars are connected to one another, e.g. they change one into the other, and define a self-contained spring loop. This preferred embodiment of the holding arrangement, relative to an embodiment with discrete individually supported spring bars, has significant advantages with respect to assembly and disassembly of the resilient arrangement, production of the resilient arrangement as well as its support receptacles on the frame, and moreover, with the preferably roundly connected end portion it is ensured that in the resilient motion of the spring bars only extremely low friction occurs in the receptacles.

In the preferred embodiment of the holding arrangement according to the invention, the spring bars are bent toward the frame center. This has the advantage in particular in the implementation of the spring arrangement as a preferably closed polygon that, viewed radially, through the stated bending the frame portions with the receptacles can be disposed outside of the engagement region on the plane workpiece.

But it is quite conceivable, in particular in the implementation of the spring arrangement as a, preferably closed, polygon train with relatively few corners, such as with three or more corners, to implement the holding arrangement with linear spring bars according to the invention.

Furthermore, the spring bars preferably comprise a spring wire, formed correspondingly.

Although the holding arrangement according to the invention can define with the spring bars a three-dimension curve, corresponding to the three-dimensional curve of a workpiece edge band, which is not planar but rather can have any desired shape, unless correspondingly formed plane workpieces require it, it is suggested according to a preferred embodiment, that at least for disk-shaped workpieces the spring bars describe essentially a plane and the receptacles on the frame are disposed at least essentially in a plane.

It is furthermore suggested to implement the receptacles as a common groove extending around the frame. This has several significant advantages in particular if the spring bars, possibly except for an interface, describe a self-contained loop, specifically:

Different spring bar polygons can be flexibly disposed on the same frame.

Polygons which have an extraordinary large number of corners can be used. In that case preferably the spring bars between the corner portions are bent radially inwardly in order to form engagement portions on the workpiece edge which are offset from the groove radially inwardly.

The spring bars or the spring bar polygon are guided or supported precisely.

Furthermore these embodiments are extraordinarily simple in terms of fabrication and for the use of the holding arrangement according to the invention for holding circular disk-shaped workpieces of the initially stated type.

The frame can moreover be implemented so that it does not define a continuous opening but rather carries the holding arrangement according to the invention only unilaterally in a corresponding recess.

It is preferably suggested, however, that the frame surrounds a continuous opening for the workpiece.

A further advantage of the holding arrangement according to the invention becomes apparent, namely that it acts independently of the position, i.e. the workpieces can be held in any desired spatial position.

If the band-like encircling edge face of the planar workpiece which is to be held, is planar or concavely bent inwardly, it is quite sufficient to provide in each instance locally individually acting spring bars.

But if the stated edge face is concavely bent outwardly it is suggested that the spring elements engage the workpiece edge at least in pairs or the spring bars engage the workpiece edge offset in the direction of the edge thickness of the workpiece.

Furthermore, the shadowing of the held planar workpiece is further reduced in that at least the frame portions having receptacles converge with respect to their thickness radially inwardly i.e. against the portion on the frame provided for receiving the workpieces.

Moreover, in order to provide simple and reliable insertion of the workpieces, it is suggested that on the frame at least one projection stop portion for the workpiece is provided. A carrier according to the invention for a multiplicity of the plane workpieces with a multiplicity of the stated holding arrangements according to the invention is further distinguished. Consequently the greatest possible packing density of workpieces on the carrier is achieved.

The holding arrangement according to the invention or the carrier according to the invention is used in particular for PVD (physical vapor deposition), CVD (chemical vapor deposition) or mixed forms of these processes such as PECVD (plasma enhanced chemical vapor deposition), in all of their known implementations, as well as for etching processes and thermal processes, consequently for processes which in most instances are carried out in a vacuum atmosphere, except for the CVD processes and thermal processes which can also be carried out under atmospheric pressure conditions.

These processes are listed by way of example only. For the expert, within the framework of his technical knowledge, further application options of the holding arrangement or the carrier arrangement according to the invention are possible. The same applies with respect to the workpieces preferably used with holding devices and carriers of this type.

A preferred application of the holding arrangement or the carrier is also specified. According to the invention, the holding arrangement or the carrier is suitable in particular for holding disks whose thickness is between 0.5 and 2 mm (each inclusive).

BRIEF DESCRIPTION OF THE DRAWINGS

In the following the invention is explained by example in conjunction with the drawings, wherein:

FIG. 1 schematically illustrates a holding device according to the invention on a frame of any desired shape, wherein, in a minimum configuration, a spring loop is implemented as a triangle or, through individual spring bars, a polygon is defined, Fig. 1a is an enlarged detail showing a receptacle of another embodiment of the present invention, FIG. 2 is a schematic diagram of a further embodiment of the holding device according to the invention in which a spring bar loop is formed as a three-dimensional polygon of any shape frame, implemented in any desired shape in order to indicate that, depending on the workpieces to be held, the holding device according to the invention can readily be applied.

DESCRIPTION OF THE PREFERRED EMBODIMENTS

Figure 3:
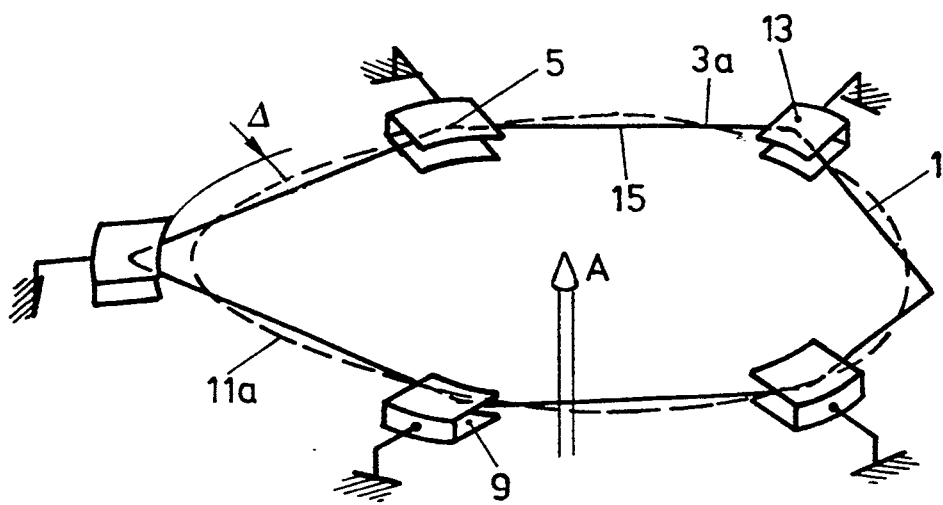
FIG. 3 is a perspective and schematic view of a first embodiment of the holding device according to the invention for planar workpiece disks and with linear spring bars.

FIG. 1 depicts the minimum configuration of a holding device according to the invention. It comprises an encircling spring loop 1 here implemented as a triangle. The spring loop 1 is formed by spring bars 3 which, each have opposite ends that at corner portions 5, in a preferred manner, are integrally joined. The loop can also be defined by individually supported spring bars 3 with opposite free ends such as shown at FIG. 1a using two of the bars 3 by example. The spring loop 1 is supported on its corner portions 5 in a frame 7, depicted schematically in FIG. 1, of any desired shape which for this purpose has recesses or receptacles 9 wherein are located the stated corner portions 5. The receptacles 9 are in an edge surface of the frame 7, around the open space defined by the frame. Recesses 9 are implemented so that the corner portions 5 are therein disposed rather loosely so that they can move and so that the spring loop 1, as a function of its radial spreading R, upon insertion of the edge face S of a disk-shaped workpiece 11, as shown in FIG. 1 by a segment, can freely and resiliently change its form. In the depicted embodiment of FIG. 1 the insertion of a workpiece 11 whose circumferential contour slightly exceeds that formed by the loop 1, the stated radial spreading takes place with a simultaneous radial inward motion r of the corner portions 5 as well as the spreading of the corner angle α. Each bar 3, thus engages the edge face S of a workpiece at a location between the ends of the bar.

FIG. 2 schematically depicts how the spring loop 1, used according to the invention and at least defined by spring bars 3, can be shaped spatially practically in any desired way to form a polygon and be inserted on correspondingly provided receptacles 9 on a frame 7a shaped practically in any desired way, if the workpieces to be held require the holding along complicated circumferential edge contours.

FIG. 3 illustrates a hexagonal spring loop 1 defined by means of linear spring bars 3a in which at least a significant portion of the polygon corner portions 5 are supported in schematically depicted receptacles 9 on the frame. As can be seen, not all corner portions 5 need to be supported in receptacles, but, preferably in each instance, between two corner portions that are supported on receptacles, only one is left unsupported.

A disk-shaped workpiece 11a to be placed in the holder, is shown in dashed lines.

It is apparent in this representation that with an increasing number of polygon corners in the loop 1, the layout of the frame portions 13 defining the receptacles 9 become increasingly more critical with respect to their radial dimensions Δ from the engagement region of the linear spring bars 3a on the workpiece 11a, denoted in FIG. 1 and the position 15 of the bars 3a. This problem is solved in the preferred embodiment according to FIG. 4 in that the spring loop 1a with spring bars 3b are not linear but bent inwardly toward the center Z of the loop 1a or of a frame region for the workpiece. It is immediately evident that consequently the radial dimension Δ relevant for the possible bending-out of the spring bars 3b becomes enlarged. Therewith it is possible, in particular in the case of this embodiment, to use polygons having a large number of corners as the spring loop and therewith to hold a disk-shaped workpiece with a holding force distributed practically homogeneously along its circumference. This is also relevant taking into consideration thermal expansions which, with an embodiment of this type, with multicorner polygons, can be taken up essentially distributed uniformly on the workpiece circumference, which in particular in holding thin workpieces is significant in view of the change of their shape.

Figure 4:
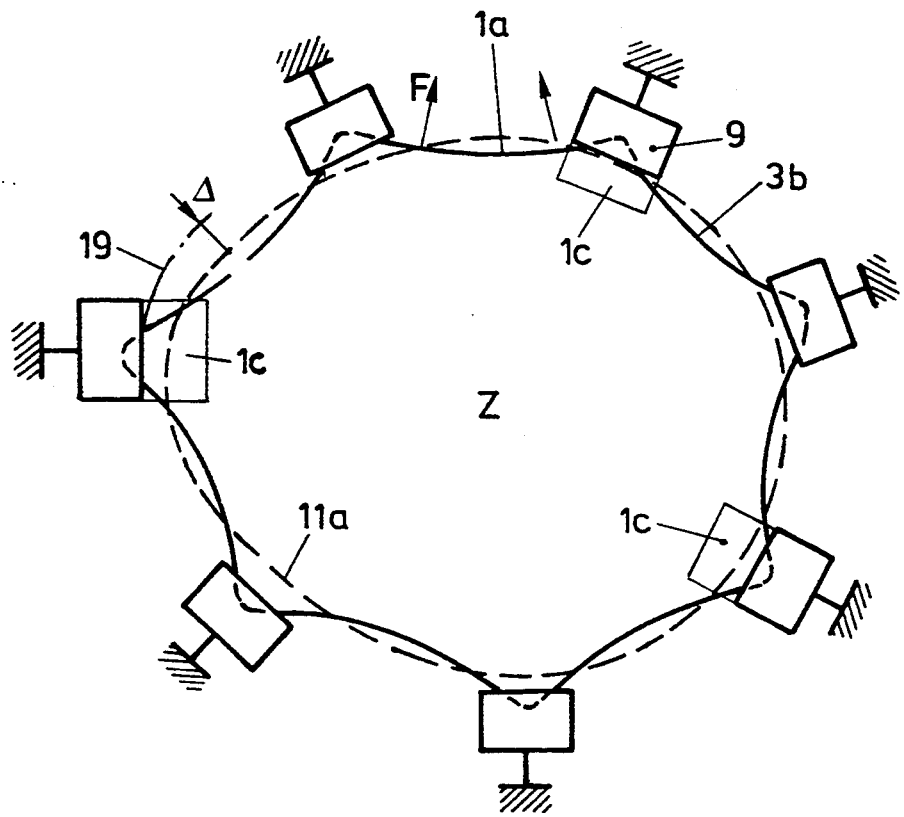
FIG. 4 is a schematic top view onto a further embodiment of the holding arrangement according to the invention with spring bars bent radially inwardly, in the case of a high number of polygon corners, with the simultaneous representation of the transition of the individual receptacles to form one encircling receptacle groove.

In FIG. 4 now a further preferred development is depicted in dot-dash lines according to which the discretely depicted receptacles 9, shown in full lines, are implemented as a groove 19 on the frame. Therewith the greatest possible degree of freedom is obtained to insert on one and the same frame provided with such a groove 19, different polygon spring loops and, in particular, also to increase, practically to any desired extent, the number of polygon corners.

By means of such a groove, furthermore, the stability of the spring loop 1 is increased, which is significant in particular in the case of thin large-area workpieces. Through the selection of the spring characteristic, be this of the individually supported spring bars or of the spring loop defined by such spring bars, for specific workpieces, an optimal adaptation of the holding device used in each instance to a workpiece to be held in each instance has taken place.

As has already been stated, the spring loop can be defined through individually supported spring bars, but is preferably defined through spring bars connected in the corner portions so that an encircling spring bar loop is formed which at most is open along its circumference at only one site in the sense of a clasp.

As is evident on the basis of the embodiments described so far extremely thin disk-shaped workpieces can be held, for example in particular disks having a thickness D $0.5 \text{ mm} \leq D \leq 2 \text{ mm}$. Through the holding and supporting spring bars, the covering of any of the workpiece surfaces is avoided, the workpiece can expand radially on all sides for example due to thermal load, and in particular, in the case of polygons with a large number of corners as the spring loop, the resulting tensions are homogeneously taken up and distributed over the circumference of the workpiece.

A holding arrangement of this type, in particular in the last stated embodiment, is especially well suited for the holding of thin storage disks of the above stated order of thicknesses, as with approximately 1.2 mm thickness, such as for example in CD storage disks, magneto-optical storage disks, hard disk storage disks or semiconductor wafers.

For extremely sensitive workpieces an additional device can be provided in order to bend open the spring bars when placing these disks, such as is depicted for example in FIG. 4 by the forces F on one of the spring bars, which preferably engage on the spring where the latter do not engage the workpiece, consequently, as shown in FIG. 4, laterally offset.

Since furthermore, as can be clearly seen in particular in FIGS. 3 and 4, the workpieces to be held are inserted in the axial direction A into the spring loop or are removed from it, the danger of damaging the workpiece surface is vanishingly small and the friction path along which the holding device according to the invention slides with friction on the workpiece in the process of establishing or dissolving the hold, which two factors drastically reduce the danger of contamination of a treatment chamber, in particular of a vacuum treatment chamber, with friction particles. The forces acting radially upon the workpiece are determined and clearly defined through workpiece dimension and spring behavior of the spring loop of spring bars. The simple insert ability or removability of the workpieces in the direction A of FIG. 3 permits readily and in simple manner the automatic handling of workpieces.

In order to create, in particular for inserting the workpieces, a clear stop position, a stop arrangement for the placed workpiece is provided as shown purely schematically at 1c in FIG. 4.

Figure 5:
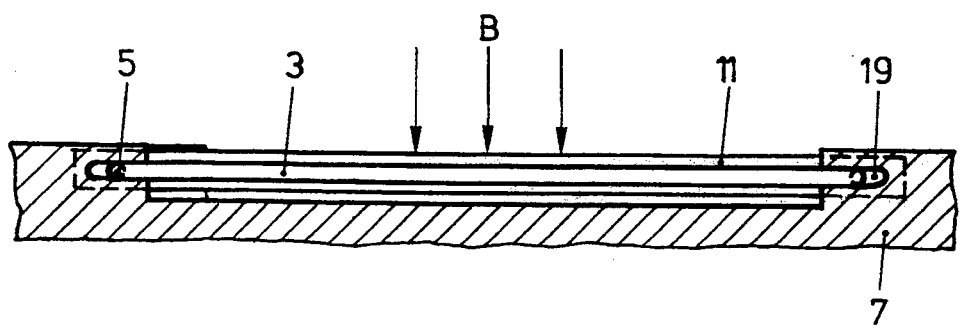
FIG. 5 is a schematic drawing of an embodiment of a frame for an exclusively unilateral workpiece treatment.

FIG. 5 schematically illustrates a frame 7 in which the receptacles are implemented jointly as an encircling groove 19. The frame shown in FIG. 5 with spring loop 3 is closed on one side and permits the unilateral treatment B of the placed workpiece 11.

Figure 6:
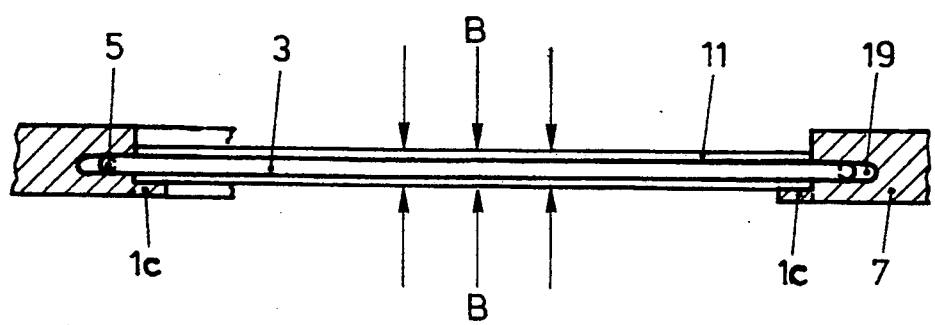
FIG. 6 is a representation analogous to FIG. 5 of the preferred frame design used with a continuous opening, FIG. 7a schematically illustrates an embodiment of the holding arrangement according to the invention for essentially planar workpiece edge faces perpendicular to the disk face.

In contrast, the frame 7 shown in FIG. 6 permits in preferred manner with a continuous opening, the bilateral treatment B, of the disk-shaped workpiece 11.

Figure 7A:
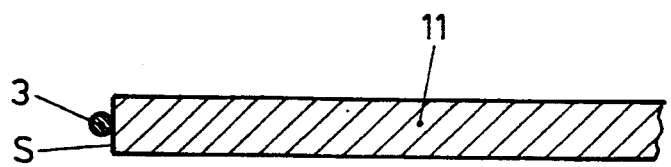
FIG. 7b illustrates a preferred embodiment of the holding arrangement according to the invention for workpiece edge faces which bulge outwardly.
Figure 7B:
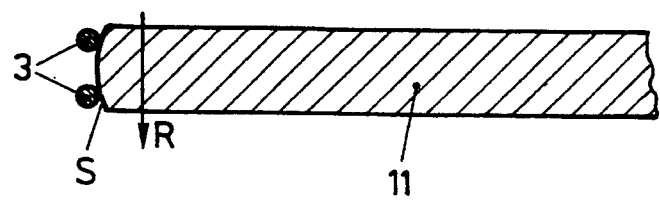

FIG. 7a depicts schematically a cross sectional area of a disk-shaped workpiece 11. According to FIG. 7a workplace 11 has a cylindrical edge face S, and in FIG. 7b a non-cylindrical edge face, in particular with outwardly arcuate edge face S. In the first case, individual spring bars 3 are provided preferably locally distributed over the circumference of the workpiece 11, in the second case either in pairs, essentially parallel to each other, or the bars are disposed staggered or offset in the direction R, consequently essentially in the direction of the thickness expansion of the edge, whereby, in the case according to FIG. 7b, the disk-shaped workpiece 11 is held in a defined position. It is understood that in the case of a "double spring loop" 1 according to FIG. 7b on the frame is provided accordingly an arrangement of double receptacles 9. Depending on the thickness and shape of the workpiece edge, consequently the arrangements of spring bars are provided which are necessary for stable holding of the workpiece.

Figure 8:
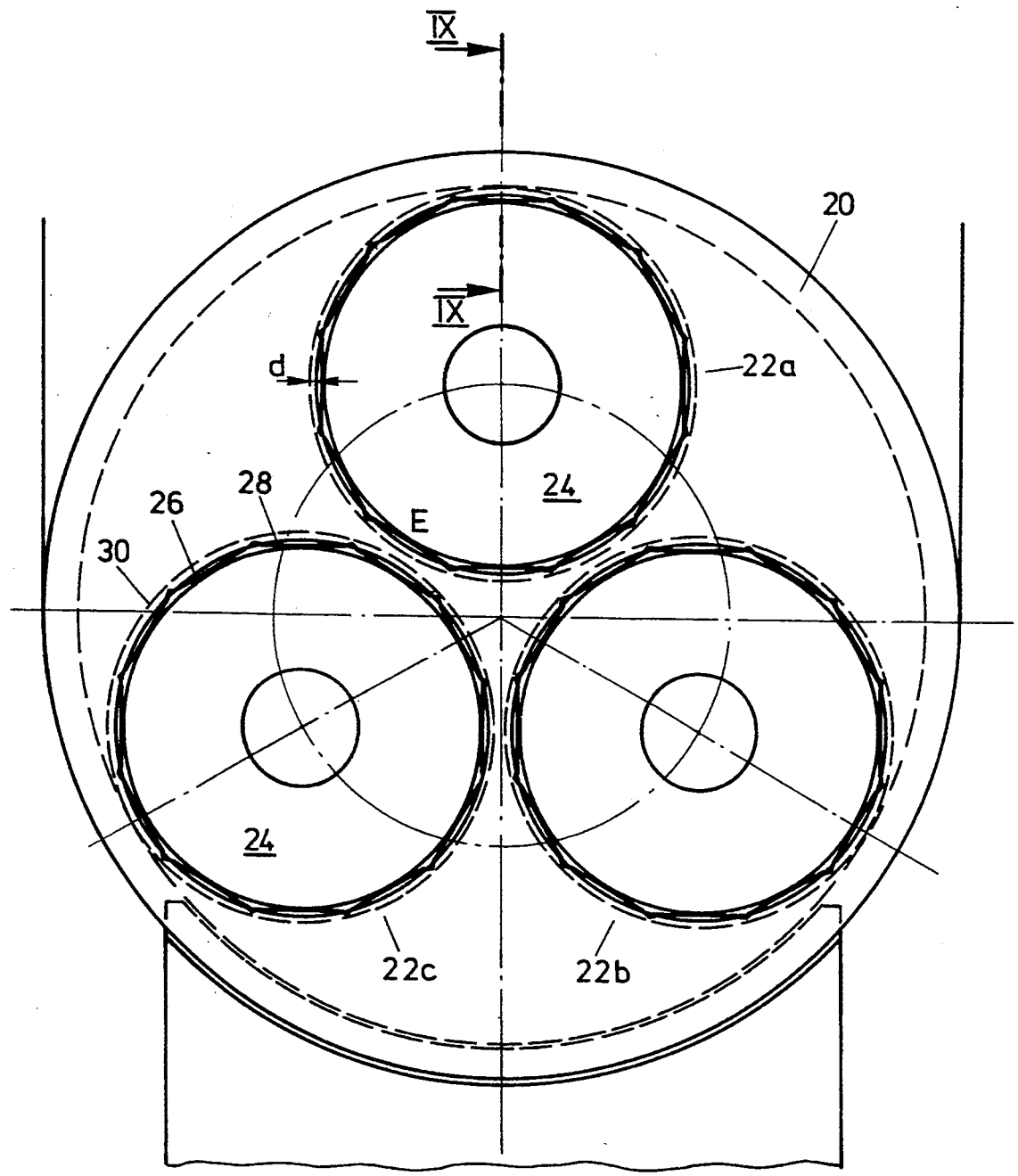
FIG. 8 is a top view onto a carrier according to the invention for three storage disks for a vacuum surface treatment thereof.

FIG. 8 is a view onto a carrier 20 according to the invention, on which three holding arrangements 22a to 22c are provided, essentially implemented as depicted in FIG. 4. The carrier 20 has circular openings which in the representation according to FIG. 8, are filled by the accepted circular disk-shaped workpieces 24, for example storage disks to be treated. The three identically implemented holding arrangements each have a spring loop 26, formed by a polygon with many corners and spring bars 28, bent radially inward and formed by corresponding to the spring bars 3b of FIG. 4. The receptacles are formed in common by the encircling groove 30 in analogy to the embodiments of groove 19 in FIG. 4.

It must be pointed out that the smallest distance between adjacent workpiece disks 24 is in region E given essentially by the depth d of the particular groove. Consequently the greatest possible packing density of adjacent workpieces on carrier 20 is achieved.

The carrier 20 can be implemented as an arcuate concave carrier as is customary in coating installations and be implemented so as to be stationary or rotatable about its center axis.

Figure 9:
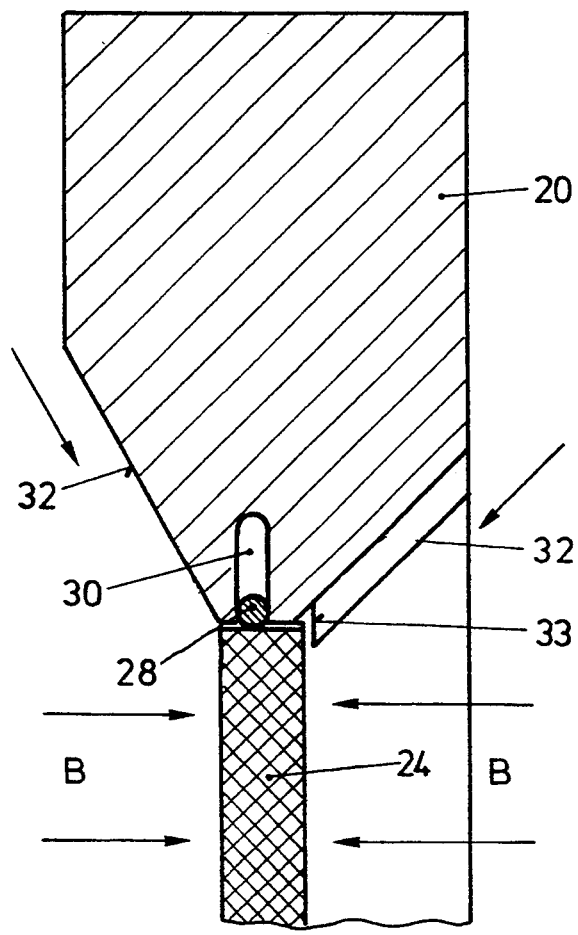
FIG. 9 is a partial radial section taken along line 9—9 of FIG. 8.

In FIG. 9 a cross sectional view along line 9—9 of FIG. 8 is shown through the carrier 20. It is in particular evident that the frame portion in which is provided the groove 30 or in general a provided take-in for receiving corner portions of the polygon, as indicated by faces 32, is inwardly converging, or tapered by which a shadowing of the margin zones of the workpiece 24 with respect to treatment B is avoided. Furthermore it is evident in FIG. 9 that a stop face 33 for the workpiece 24 can be provided.

While a specific embodiment of the invention has been shown and described in detail to illustrate the application of the principles of the invention, it will be understood that the invention may be embodied otherwise without departing from such principles.

What is claimed is:

1. A holding arrangement for a workpiece comprising:

a frame defining an open space for receiving a workpiece, the frame having an edge surface around the open space, with a plurality of recesses in the edge surface;

at least two elongated spring bars extending freely across said open space, each bar having opposite ends; and each end of each of said spring bars being disposed in one of said recesses in the edge surface of the frame, each end being movable in its respective recess so as to allow movement of said ends as said bars are bent to introduce a workpiece between said bars and thereby a distance between said ends is changed.

2. A holding arrangement according to claim 1 wherein said spring bars are connected to each other at lease one of their ends.

3. A holding arrangement according to claim 2 wherein the connected ends of the spring bars form a corner, of a polygon.

4. A holding arrangement according to claim 1 wherein the spring bars are linear.

5. A holding arrangement according to claim 1 wherein the spring bars are bent inwardly toward a center of the frame.

6. A holding arrangement according to claim 1 wherein the spring bars are constructed of spring wire material.

7. A holding arrangement according to claim 1 wherein said spring bars extend in a common frame being arranged along a plane.

8. A holding arrangement according to claim 1 wherein, with the opposite ends of each spring bar each disposed and movable in a respective one of said recesses, each spring bar engaging a workpiece in the open space at a location on each respective spring bar which is intermediate the opposite ends of each respective spring bar.

9. A holding arrangement according to claim 1 wherein said open space of the comprises frame an opening for receiving a workpiece therein.

10. A holding arrangement according to claim 1 wherein the frame comprises a frame member having a plurality of open spaces each for receiving a different workpiece, and at least two of said elongated spring bars extending freely across each of said open spaces.

11. A holding arrangement according to claim 1 wherein said frame comprises a substantially flat frame member, said open space comprising an opening through said frame member.

12. A holding arrangement according to claim 1 wherein the frame includes at least one stop extending into the open space for stopping a movement of a workpiece through the open space.

13. A holding arrangement according to claim 1 wherein at least one of the spring bars comprises a pair of parallel and offset spring bar elements, offset in a direction of thickness of the edge surface.

14. A holding arrangement according to claim 1 wherein the edge surface of the frame is tapered.

15. A holding arrangement according to claim 1 including means for supporting the frame in a surface treatment apparatus.

16. A holding arrangement according to claim 11 wherein the spring bars are adapted for holding a disk-shaped workpiece having a thickness of from 0.5 to 2 mm.

17. A carrier according to claim 1 wherein said spring bars are adapted for holding a disk-shaped workpiece selecting from the group consisting of a storage disk, a CD disk, a hard disk, a magneto-optical disk, and a semiconductor wafer.

18. A holding arrangement according to claim 1 wherein said recesses are formed by a groove in the edge surface of the frame.

19. A holding arrangement according to claim 1 comprising at least three of said elongated spring bars each having opposite ends, at least some of said ends being connected to each other to form corners of a spring bar polygon.

* * * * *